United States Patent [19]

Lange et al.

[11] Patent Number: 5,612,907

[45] Date of Patent: Mar. 18, 1997

[54] METHOD OF SIMULATING AT LEAST ONE COMPONENT WHOSE CHARACTERIZING FEATURES ARE DESCRIBED BY A SET OF PAIRS OF VALUES, BY MEANS OF A SIMULATOR ON A COMPUTER

[75] Inventors: Eberhard Lange, Obermichelbach; Jürgen Haible, Erlangen-Tennenlohe, both of Germany

[73] Assignee: Siemens Aktiengesellschaft, Munich, Germany

[21] Appl. No.: 382,034

[22] PCT Filed: Aug. 6, 1993

[86] PCT No.: PCT/EP93/02105

§ 371 Date: Feb. 10, 1995

§ 102(e) Date: Feb. 10, 1995

[87] PCT Pub. No.: WO94/04987

PCT Pub. Date: Mar. 3, 1994

[30] Foreign Application Priority Data

Aug. 13, 1992 [DE] Germany .......................... 92113834.3

[51] Int. Cl.⁶ .............................. G06F 9/455; G06F 17/50
[52] U.S. Cl. ................................................................. 364/578
[58] Field of Search ................................ 364/578, 413.07, 364/497, 551.01; 395/87, 500; 318/568.1

[56] References Cited

U.S. PATENT DOCUMENTS

| | | | |
|---|---|---|---|
| 4,663,726 | 5/1987 | Chand et al. | 395/87 |
| 4,740,903 | 4/1988 | Nakatsuka et al. | 364/497 |
| 5,140,236 | 8/1992 | Kawamura et al. | 318/568.1 |
| 5,287,273 | 2/1994 | Kupfer et al. | 364/413.07 |
| 5,353,239 | 10/1994 | Kashiwagi | 364/551.01 |

OTHER PUBLICATIONS

H. Spiro: Simulation integrierter Schaltungen durch universelle Rechnerprogramme, R. Oldenbourg Verlag GmbH, Muenchen, 1985, pp. 9–47.

H. Wiedemann (Racal–Redac–Design–System–GmbH): Übergeordnete Aspekte beim ASIC–Entwurf, in: Tagungsband SMT/ASIC/Hybrid 1991, 5 Internationale Fachmesse und Kongress, VDE–Verlag, Berlin, pp. 489–498.

H. Stump (Logic Modeling Systems Incorporated): Trends in Technology and EDA for the 1990's, in: Conference Record Electro/90, Ventura, USA, 1990, pp. 335–341.

B. Tuck: What Do Digital Designers Need to Master the Art of Analog Design, in: Computer Design, Aug. 1991, pp. 92–106.

*Primary Examiner*—Kevin J. Teska
*Assistant Examiner*—Matthew Loppnow
*Attorney, Agent, or Firm*—Hill, Steadman & Simpson

[57] ABSTRACT

With the invention, a method is described which permits a DP-based setting up of models for simulators. A prescribed set of data pairs, in the form in which it can for example be taken from a data sheet, is automatically interpolated. "Kinks" and extreme points in the function curves can be explicitly prescribed. Using the method according to the invention, shorter simulation times are possible and said method gives more precise results.

6 Claims, 6 Drawing Sheets

METHOD OF SIMULATING AT LEAST ONE COMPONENT WHOSE CHARACTERIZING FEATURES ARE DESCRIBED BY A SET OF PAIRS OF VALUES, BY MEANS OF A SIMULATOR ON A COMPUTER

BACKGROUND OF THE INVENTION

The invention relates to a method by which components, such as for example electronic analog components or mechanical components, can be simulated on a computer-based simulator more rapidly and precisely than hitherto usual.

During recent years, the simulation of electronic components has developed into an important topic. It is constantly emphasized that the simulation can above all improve the quality of the developed circuits and leads to an increase in productivity (H. Spiro: Simulation of Integrated Circuits by Universal Computer Programs, R. Oldenbourg, Verlag GmbH, Munich, 1985); (H. Wiedemann (Racal Redac Design System GmbH); Superordinate Aspects in the ASIC Design in: Meeting Reports SMT/ASIC/Hybrid '91, 5th International Trade Fair and Congress, VDE Verlag, Berlin, 1991); and (H. Stump (Logic Modeling Systems Incorporated): Trends in Technology and EDA for the 1990s, in: Conference Record Electro/90, Ventura, USA, 1990). However, the extent to which simulation has become widespread is relatively small, above all in the case of the development of circuit board assemblies. The reasons for this are both of an organizational and also of a technical nature.

One of the technical obstacles in simulation—both on the digital and also on the analog side—is the absence of suitable models (H. Stump (Logic Modeling Systems Incorporated): Trends in Technology and EDA for the 1990s, in: Conference Record Electro/90, Ventura, USA, 1990). While in the case of digital simulation what is involved is the logical and temporal description of a component element using a corresponding programing language, analog simulation comprises the conversion of prescribed measurement curves into mathematical equations, which must be formulated with the aid of a modeling language. Although at the present time no standard can be identified in the field of analog modeling languages, the majority of simulators do nevertheless offer at least the possibility of the input of mathematical function equations. Accordingly, the problem of the modeling is essentially reduced to obtaining such equations.

The requirements imposed on mathematical equations which are intended to describe the physical behavior of a component are divided into two groups of demands: on the one hand, the physical behavior is to be described as precisely as possible. In the case of electronic components, the theory frequently delivers differing description functions for differing working sectors. In most cases, it is not possible to describe a component over the entire working range, even with only one function. On the other hand, the models are to be as efficient as possible, and the simulator must therefore be able to process them rapidly. The more complicated are the functional descriptions, the more slowly the simulation runs. Specifically in the case of the complex circuits which are of particular interest for simulation, the factor "simulation time" plays a decisive role.

SUMMARY OF THE INVENTION

The object underlying the invention consists in specifying an improved method for simulating at least one component which operates more rapidly and more precisely than hitherto usual methods.

This object is achieved in accordance with a method for simulating at least one component, whose characterizing features are described by a set of pairs of values, by means of a simulator on a computer. In a first step for the spline interpolation a cubic spline function of the form:

$$s(x) = a_{i,3} \cdot (x-x_i)^3 + a_{i,2} \cdot (x-x_i)^2 + a_{i,1} \cdot (x-x_i) + a_{i,0}$$

is used, with pairs of values $$(x_i, y_i), i=1, \ldots, n \text{ where } n \in N$$

which are sorted in ascending sequence according to the magnitude of $x_i$ and form the interval limits of the partial intervals for the spline interpolation. The coefficients $$a_{i,3}, a_{i,2}, a_{i,1}, a_{i,0}$$

for each partial interval are determined as:

$$a_{i,0} = y_i$$
$$a_{i,1} = s'(x_i)$$
$$a_{i,2} = 1/2 \cdot s''(x_i)$$

$$a_{i,3} = \frac{s''(x_{i+1}) - s''(x_i)}{6 \cdot (x_{i+1} - x_i)}$$

using the recursion formulae $$s'(x_{i+1}) = \Delta^i - \frac{1}{3} \Delta_x^i \left( s''(x_i) + \frac{1}{2} s''(x_{i+1}) \right)$$

$$s'(x_n) = \Delta^{n-1} + \frac{1}{6} \Delta_x^{n-1} \cdot s''(x_{n-1})$$

$$\Delta_x^i := x_{i+1} - x_i$$
$$\Delta_y^i := y_{i+1} - y_i$$

$$\Delta_i := \frac{\Delta_y^i}{\Delta_x^i}$$

$$d_i := \frac{\Delta_x^i}{\Delta_x^{i+1}}$$

and with the use of $$s''(x_i) = \alpha_i \cdot s''(x_2) + \beta_i$$

$$\alpha_{i+1} = -\frac{1}{\alpha_i d_i + 2 \cdot (1 + d_i)}$$

$$\beta_{i+1} = \frac{1}{\alpha_i d_i + 2 \cdot (1 + d_i)} \cdot \left( 6 \frac{\Delta^{i+1} - \Delta^i}{\Delta_x^{i+1}} - d_i \beta_i \right)$$

$$\alpha_1 = \beta_1 = 0.$$

as well as the boundary conditions for natural splines $$s''(x_1)=0 \text{ and } s''(x_n)=0$$

For all pairs of values a function $s(x)$ is found which allocates in each instant to the one value of a respective pair of values the other value of the pair of values. Index "'" signifies 1st derivative and Index "''" signifies 2nd derivative. In a further step, the function found is used in the simulator in order to determine arbitrary pairs of values for the component.

All remaining further developments of the invention are as follows.

In one further development of this method:

a) a non-differentiable point (D) in the progression of the function is generated in that the set of pairs of values is subdivided into two subsets in which the point is included; and b) the spline interpolation is carried out for each subset, the point being used on one occasion as upper interval bound and on the other occasion as lower interval bound related to the two subsets for the spline interpolation.

Another further development of this method in which extreme points (E) are prescribed for the function, the coefficients a are determined using the same recursion formulae in the following manner:

a) for $x_1$ as extreme point with the use of:

$$\alpha_1 = -\frac{1}{2}$$

$$\beta_1 = 3 \frac{\Delta^1}{\Delta_x^1}$$

as well as the extreme value conditions $$s'(x_1)=0 \text{ and } s''(x_n)=0$$

b) for $x_n$ as extreme point, with the use of:

$$s'(x_n)=c_n \cdot s'(x_1)+e_n$$

as well as the extreme value conditions:

$$s''(x_n) = -3 \frac{1}{1+\frac{1}{2}\alpha_{n-1}} \cdot \left( \frac{\Delta^{n-1}}{\Delta_x^{n-1}} + \frac{1}{6} \beta_{n-1} \right).$$

as well as the extreme value conditions:

$$s''(x_1)=0 \text{ and } s'(x_n)=0.$$

In the first instance, the mathematical principles which are relevant for he modeling are described. Subsequently, the method invented by us is presented. Following this, the performance is demonstrated with reference to a practical example (current-limiter diode F452).

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
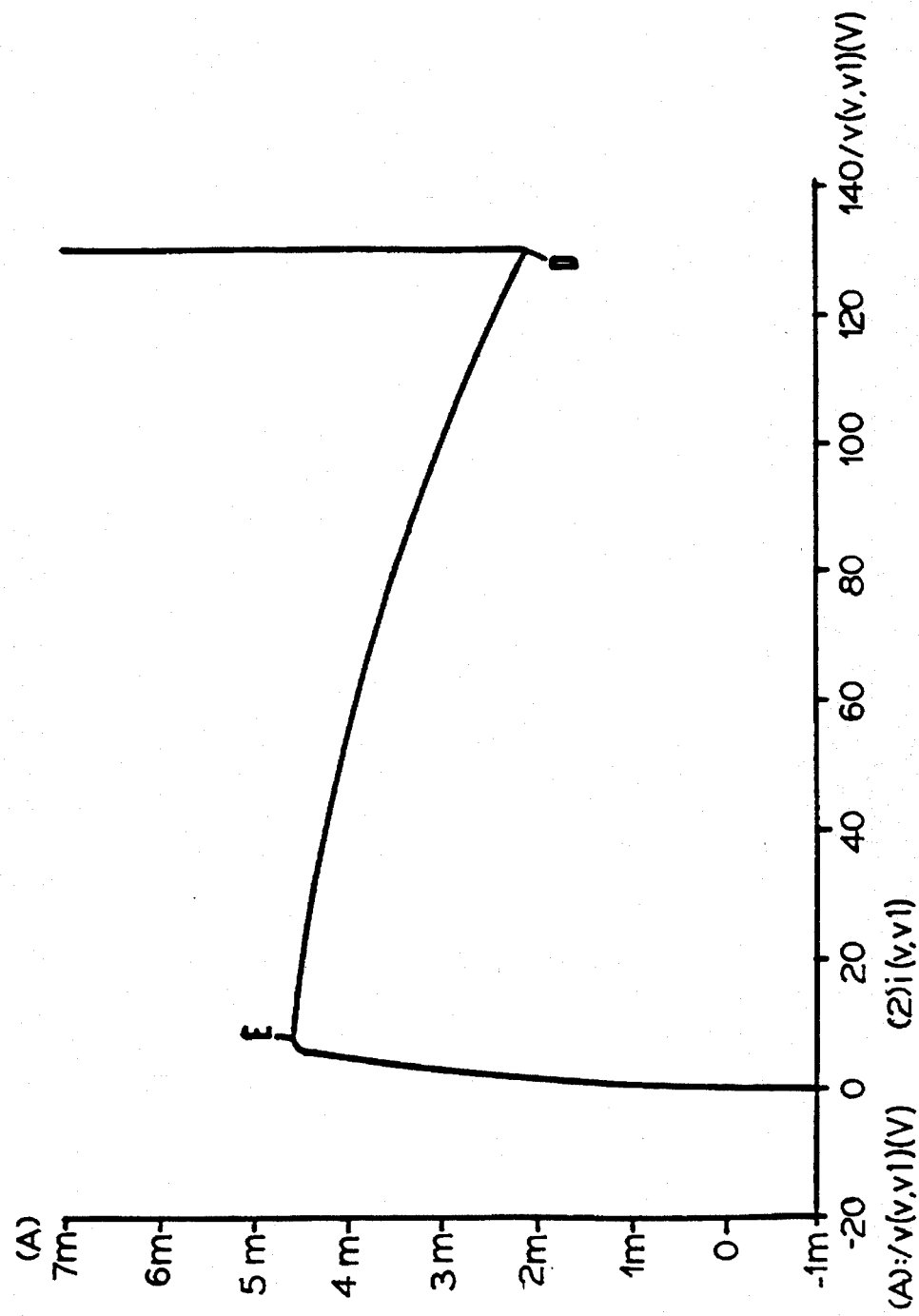
FIG. 1 shows the result of a simulation of a diode F452 using the method according to the present invention. (Current-voltage characteristic)

Mathematical Principles
Prerequisites

We proceed on the basis of the fact that the physical behavior of a component is graphically prescribed in the form of a function f. From the graph of the function, it is possible to derive data points $(x_i, y_i)$, i=1, ..., n where n$\in$N and $Y_i$=f($x_i$). The aim is to describe these data points and the curve progression, lying therebetween, of the function f by mathematical functions as well as possible.

Let n$\in$N, M := {1,2, ..., n}. Let a,b $\in$R where a<b. Let $(x_i)_{i \in M}$ be a real, increasing family with $x_1$=a, $x_n$=b, let $(y_i)_{i \in M}$ be a real family. In these circumstances, the partitioning of the interval I:=[a,b] is understood to be the set of partial intervals $I_i$, i$\in$M\{n}, where $I_i$:=[$x_i$,$x_{i+1}$]. The family $(x_i,y_i)_{i \in M}$ is also designated as the set of data points D.

Let m$\in$N. Then $C^m$[I] designates the set of the functions which are continuously differentiable m times with respect to I.

Splines

Let I:=[a,b] be an interval with an associated partitioning. A spline of degree m (m$\in$N) is understood to be a functions defined with respect to I: I$\rightarrow$R, x$\rightarrow$s(x) with the following additional properties:

(i) s$\in C^{m-1}$[I]

(ii) On each partial interval $I_i$, s is a polynomial at most of degree m.

The property (i) means that a spline of degree m is continuously differentiable (m–1) times.

A spline is referred to as a cubic spline if its degree is m=3. Thus, a cubic spline is continuously differentiable twice and is, on each partial interval $I_i$, a polynomial of at most the third degree.

A spline is referred to as an interpolating spline for the partitioning $I_i$ and for the set of data points D if the following is applicable:

$$s(x_i)=y_i \text{ for } i=1, \ldots, n \quad (2.1)$$

Cubic interpolating splines are simply referred to as splines hereinbelow.

Existence and Uniqueness of the Splines

Let I:=[a,b] again be an interval with an associated partitioning. Let the following be applicable: f$\in C^2$[I], s: I$\rightarrow$R spline. If s satisfies one of the following conditions, then s is uniquely determined:

(i) $s''(a)=s''(b)=0$ (ii) $s'(a)=f'(a)$ and $s'(b)=f'(b)$ \quad (2.2)

In the case (i), s is also designated as a natural spline. In the case (ii), it is presumed that the derivatives of the function f are know at the marginal points a,b.

Practical Consequences of the Interpolation with Splines

Since s$\in C^2$[I], it follows in particular that at the data points the following is applicable:

$$s(x_i^+)=s(x_i^-)=y_i \text{ for } i=1, \ldots, n \quad (2.3)$$

$$s'(x_i^+)=s'(x_i^-) \text{ for } i=2, \ldots, n-1 \quad (2.4)$$

and $$s''(x_i^+)=s''(x_i^-) \text{ for } i=2, \ldots, n-1 \quad (2.5)$$

In this case, $s(x_i^+)$ designates the function value of the spline which is given by the representative third order polynomial in the partial interval [$x_i$, $x_{i+1}$] at the position $x_i$. Similarly, $s(x_i^-)$ designates the function value of the polynomial in the partial interval [$x_{i-1}$,$x_i$] at the position $x_i$.

Thus, the data points $(x_i,y_i)_{i \in M}$ are interpolated by a twice continuously differentiable function. The data points lie explicitly on the graph of the function. In particular, the result is a smooth curve, which possesses no "jumps" (discontinuities) or "kinks" (non-differentiable positions).

The second derivative $s''(x)$ of the spline is a linear polynomial on each partial interval.

Minimum Property of the Splines

The set of functions which are continuously differentiable on the interval I and whose second derivative exists almost everywhere and is quadratically Lebesgue-integrable, is designated by $H^2[I]$. For functions $f \in H^2[I]$ it is accordingly possible to define the seminorm $$\|f\| := \sqrt{\int_a^b |f''(x)|^2 dx}$$

$|f''(x)|$ is a measure of the curvature behavior of f at the position x. The curvature in the root mean square is thus specifically given by $\|f\|$.

The minimum property of the splines now states that the natural spline s of all functions $f \in C^2[I]$, for which $f(x_i)=y_i$ applies for $i=1, \ldots, n$, gives the smallest possible value for the curvature in the root mean square. In this sense, the spline is accordingly the smoothest interpolating function for the given data points.

Convergence Property of the Splines

Splines converge to the function which they interpolate if the partitionings $I_i$ are selected progressively more finely. This applies in contrast to interpolation using customary polynomials. In the case of interpolation with splines, there is accordingly no restriction, on fundamental grounds, in the attainable accuracy of the interpolation.

Spline Algorithms as Matrix Equations

The systematic evaluation of the conditions set out previously leads to matrix equations which can be solved with the aid of algorithms for linear systems of equations (for further details, see B. Truck, "What Do Digital Designers Need to Master the Art of Analog Design", Computer Design 30 11, 1991).

Arc Length of Splines

The arc length of an arbitrary function, ie. in particular of the spline s, is given by $$b(s) = \int_a^b \sqrt{1 + (s'(x))^2} \, dx \quad (2.6)$$

This integral may indeed in principle be explicitly computed; however, this is very tedious. In the specific computation, recourse is therefore had to numerical methods (see for example see B. Truck, "What Do Digital Designers Need to Master the Art of Analog Design", Computer Design 30 11, 1991).

Description of the Algorithms

Prerequisites

The data points are in practice in most cases obtained from a function curve prescribed on a data sheet. Such physical curves frequently include, at least in terms of appearance, "kinks" which to a first approximation can be regarded as non-differentiable points. This is the case, for example, with the characteristic of a diode (break-down voltage). Therefore, the possibility of non-differentiable points is explicitly provided in the algorithms described here. Further significant points which can be taken from a data sheet are relative maxima and minima. The possibility of defining specified points explicitly as extreme values is likewise provided in our algorithms.

Closed Spline Algorithm

The interpolation with splines may also be formulated without the use of matrices as algorithm. In this subsection, the core element of our algorithms is formulated as a matrix-independent natural spline interpolation. The algorithm is autonomous, and in particular no matrices are used.

The spline in the partial interval $I_i$ may be written as $$s(x) = a_{i,3} \cdot (x-x_i)^3 + a_{i,2} \cdot (x-x_i)^2 + a_{i,1} \cdot (x-x_i) + a_{i,0} \quad (3.1)$$

where $i \in M \setminus \{n\}$ with $n > 1$.

The objective of the algorithm is therefore the determination of the coefficients $a_{i,0}, a_{i,1}, a_{i,2}$ and $a_{i,3}$ in each partial interval. For $n<2$ (partial interval with fewer than two points) the algorithm is not applicable and is interrupted by an error. Likewise, data points whose ordinates are not arranged in ascending sequence ($x_j \leq x_{j+1}$) lead to an error and interruption.

The following is obtained by differentiation of (3.1):

$$s'(x) = 3 \cdot a_{i,3} \cdot (x-x_i)^2 + 2 \cdot a_{i,2} \cdot (x-x_i) + a_{i,1}$$

$$s''(x) = 6 \cdot a_{i,3} \cdot (x-x_i) + 2 \cdot a_{i,2} \quad (3.2)$$

The following is obtained from (3.1) and (3.2):

$$s(x_i) = a_{i,0}$$

$$s'(x_i) = a_{i,1}$$

$$s''(x_i) = 2 \cdot a_{i,2}$$

$$s''(x_{i+1}) = 6 \cdot a_{i,3} \cdot (x_{i+1} - x_i) + 2 \cdot a_{i,2}$$

Solution of these equations for the coefficients gives $\forall i \in M \setminus \{n\}$:

$$\begin{aligned} a_{i,0} &= y_i \\ a_{i,1} &= s'(x_i) \\ a_{i,2} &= 1/2 \cdot s''(x_i) \\ a_{i,3} &= \frac{s''(x_{i+1}) - s''(x_i)}{6 \cdot (x_{i+1} - x_i)} \end{aligned} \quad (3.3)$$

The first and second derivatives $s'(x_i)$ and $s''(x_i)$ can be computed by an iterative method. To this end, in the first instance differences $\Delta_x^i$, $\Delta_y^i$ and difference quotients $\Delta^i$ are defined:

$$\Delta_x^i := x_{i+1} - x_i$$

$$\Delta_y^i := y_{i+1} - y_i$$

$$\Delta^i := \frac{\Delta_y^i}{\Delta_x^i} \quad (3.4)$$

With the aid of the equations (3.1) and (3.2), the following is obtained:

$$s(x_{i+1}) = a_{i,3} \cdot (\Delta_x^i)^3 + a_{i,2} \cdot (\Delta_x^i)^2 + a_{i,1} \cdot \Delta_x^i + a_{i,0}$$

$$s'(x_{i+1}) = 3 \cdot a_{i,3} \cdot (\Delta_x^i)^2 + 2 \cdot a_{i,2} \cdot \Delta_x^i + a_{i,1}$$

$$s''(x_{i+1}) = 6 \cdot a_{i,3} \cdot \Delta_x^i + 2 \cdot a_{i,2} \quad (3.5)$$

In this case, the results for $a_{i,2}$, $a_{i,1}$ and $a_{i,0}$ from the equations (3.3) can be used:

$$s(x_{i+1}) = a_{i,3} \cdot (\Delta_x^i)^3 + \tfrac{1}{2} s''(x_i) \cdot (\Delta_x^i)^2 + s'(x_i) \cdot \Delta_x^i + y_i \quad (3.6)$$

$$s'(x_{i+1}) = 3 \cdot a_{i,3} \cdot (\Delta_x^i)^2 + s''(x_i) \cdot \Delta_x^i + s'(x_i)$$

$$s''(x_{i+1}) = 6 \cdot a_{i,3} \cdot (\Delta_x^i) + s''(x_i) \quad (3.7)$$

With $s(x_{i+1}) = y_{i+1}$, (3.6) gives the following:

$$\Delta_y^i = a_{i,3} \cdot (\Delta_x^i)^3 + \tfrac{1}{2} s''(x_i) \cdot (\Delta_x^i)^2 + s'(x_i) \cdot (\Delta_x^i)$$

Solving for $a_{i,3}$ now gives:

$$a_{i,3} = \frac{\Delta y^i}{(\Delta_x^i)^3} - \frac{s''(x_i)}{2 \cdot \Delta_x^i} - \frac{s'(x_i)}{(\Delta_x^i)^2} \quad (3.8)$$

If equation (3.8) is substituted in equations (3.7), then this gives iterative equations for the first and second derivatives $s'(x_i)$ and $s''(x_i)$:

$$s'(x_{i+1}) = 3 \cdot \Delta^i - 1/2 s''(x_i) \cdot \Delta_x^i - 2 \cdot s'(x_i) \quad (3.9)$$

$$s''(x_{i+1}) = 6 \frac{\Delta^i}{\Delta_x^i} - 2 \cdot s''(x_i) - 6 \frac{s'(x_i)}{\Delta_x^i}$$

Similar considerations apply to $s''(x_{i+2})$:

$$s''(x_{i+2}) = 6 \frac{\Delta^{i+1}}{\Delta_x^{i+1}} - 2 \cdot s''(x_{i+1}) - 6 \frac{s'(x_{i+1})}{\Delta_x^{i+1}} \quad (3.10)$$

If $s'(x_i)$ and $s'(x_{i+1})$ are eliminated from the equations (3.9) and (3.10), then the result is an equation in which only the second derivatives continue to appear:

$$s''(x_{i+2}) = 6 \frac{\Delta^{i+1} - \Delta^i}{\Delta_x^{i+1}} - 2 \cdot s''(x_{i+1}) \cdot (1 + d_i) - d_i \cdot s''(x_i) \quad (3.11)$$

for $i \in M \setminus \{n-1, n\}$ and $$d_i := \frac{\Delta_x^i}{\Delta_x^{i+1}}$$

Using the iterative formulation $$s''(x_i) = \alpha_i s''(x_{i+1}) + \beta_i \quad (3.12)$$

($i \in M \setminus \{n\}$) and the initial value for a natural spline $$s''(x_n) = 0 \quad (3.13)$$

the following is obtained from equation (3.11) for $i \in M \setminus \{n-1, n\}$:

$$6 \frac{\Delta^{i+1} - \Delta^i}{\Delta_x^{i+1}} - d_i \cdot (\alpha_i \beta_{i+1} + \beta_i) - 2 \cdot (1 + d_i) \cdot \quad (3.14)$$

$$\beta_{i+1} - s''(x_{i+2}) \cdot [1 + d_i \alpha_i \alpha_{i+1} + 2 \cdot \alpha_{i+1} \cdot (1 + d_i)] = 0$$

Equation (3.14) is satisfied if the recursion formulae $$\alpha_{i+1} = -\frac{1}{\alpha_i d_i + 2 \cdot (1 + d_i)} \quad (3.15)$$

$$\beta_{i+1} = \frac{1}{\alpha_i d_i + 2 \cdot (1 + d_i)} \cdot \left[ 6 \frac{\Delta^{i+1} - \Delta^i}{\Delta_x^{i+1}} - d_i \beta_i \right]$$

are applicable for $i \in M \setminus \{n-1, n\}$. Since $|\alpha_1| \leq \frac{1}{2}$, it follows that in all cases also $|\alpha_i| \leq \frac{1}{2}$ (complete induction). The following is obtained from equation (3.12) for $i=1$:

$$s''(x_i) = \alpha_1 \cdot s''(x_2) + \beta_1 \quad (3.16)$$

Equation (3.16) is satisfied only for the initial values $\alpha_1 = 0$, $\beta_1 = s''(x_1)$, since according to equation (3.12) $\alpha_1$, $\beta_1$ must not be dependent upon $s''(x_2)$. In the event of a natural spline, the initial values $$\alpha_1 = B\beta_1 = 0 \quad (3.17)$$

are thus obtained.

The successive application of the equations (3.17) and (3.15) gives the coefficients $\alpha_i$, $\beta_i$ for $i \in M \setminus \{n\}$. The successive application of the equations (3.13) and (3.12) then gives all second derivatives $s''(x_i)$.

In the following, the first derivatives $s'(x_i)$ are computed. It follows directly from equation (3.9) that $$s'(x_i) = \Delta^i - \frac{1}{3} \Delta_x^i \left[ s''(x_i) + \frac{1}{2} s''(x_{i+1}) \right] \quad (3.18)$$

for $i \in M \setminus \{n\}$, as well as (combinations of both partial formulae)

$$s'(x_n) = \Delta^{n-1} + \frac{1}{3} \Delta_x^{n-1} \left[ s''(x_n) + \frac{1}{2} s''(x_{n-1}) \right]. \quad (3.19)$$

For a natural spline, the result is accordingly the following:

$$s'(x_n) = \Delta^{n-1} + \frac{1}{6} \Delta_x^{n-1} \cdot s''(x_{n-1}). \quad (3.20)$$

The equations (3.17), (3.15), (3.13), (3.12), (3.18), (3.20) and (3.3) represent a closed algorithm for the computation of the coefficients $a_{i,0}, a_{i,1}, a_{i,2}$ and $a_{i,3}$ of the spline in each partial interval $I_i$ ($i \in M \setminus \{n\}$).

Treatment of non-differentiable Points

If the function curve is to include explicitly non-differentiable points, then this may be achieved very simply by the proportionment of the set of data points $D=\{(x_i, y_i), i \in M\}$ into a plurality of subsets: let $x_j$ with $J \in M$ be a non-differentiable position, then definition takes place of subsets $M_1 := \{1, \ldots, j\}$ and $M_2 := \{j, \ldots, n\}$ of the set $M$ and application takes place of the algorithm, previously described, separately to the sets of data points $D_1 := \{(x_i, y_i), i \in M_1\}$ and Let $s_1$ now be the (natural) spline for the set of data points $D_1$ and $s_2$ be the (natural) spline for the set of data points $D_2$. Then, according to equation (2.1) it is in particular true that $$s_1(x_j) = s_2(x_j) = y_j$$

The function described by the two splines is therefore, now just as previously, continuous over the entire interval, especially at the position $x_j$.

However, in general, $$s_1'(x_j) \neq s_2'(x_j)$$

will be true, that is to say the function is no longer differentiable at the position $x_j$. The curve progression therefore exhibits a "kink".

If a plurality of non-differentiable points are present, then in a similar way a further division into subsets can be undertaken.

Treatment of Extreme Points

In the case of the occurrence of explicitly prescribed extreme points, a division of the set of data points into subsets is undertaken. The condition for an extreme point at the position $x_j$, $j \in M$ is the following $$s'(x_j) = 0 \quad (3.21)$$

The equation (3.21) represents an additional demand on the (natural) spline; it is accordingly determined on a redundant basis. In the text which follows, a description is given of the manner in which other requirements of the spline to satisfy the equation (3.21) are dropped and the manner in which the algorithm is modified.

Let $U = \{(x_i, y_i), i \in \tilde{M}\}$, $\tilde{M} = \{j_1, \ldots, j_2\}$ where $j_1, j_2 \in N$ be a subset of $D$. If $j_2 - j_1 + 1 < 3$ (partial interval with fewer than 3 points), then the algorithm is interrupted by an error. Then, in the first instance a renumbering of the indices is undertaken ($i \rightarrow i - j_1 + 1$), so that the algorithm can be applied to a set of data points $(x_i, y_i)$, $i=1, \ldots, n$ where $n = j_2 - J_1 + 1$.

A distinction is now to be drawn between two cases: (1) $x_1$ is an extreme point and (2) $x_n$ is an extreme point, not mutually exclusive.

Case (1): If $x_1$ is an extreme point, then equation (2.2) reads in analogous fashion:

$$s'(x_1)=0 \text{ and } s''(x_n)=0 \quad (3.22)$$

The spline is uniquely determined with the aid of equation (3.22). However, the result is now no longer a natural spline, since the condition $s''(x_1)=0$ has been abandoned. The initial values specified in equation (3.17) must accordingly be modified:

If equation (3.16) is substituted in equation (3.18) for i=1, then the result is:

$$s'(x_1) = \Delta^1 - \frac{1}{3} \Delta_x^1 \cdot \beta_1 - \frac{1}{2} s''(x_2) \cdot \Delta_x^1 \cdot \left[ \alpha_1 + \frac{1}{2} \right]$$

With $s'(x_1)=0$, the initial values $\alpha_1, \beta_1$ are obtained as follows:

$$\alpha_1 = -\frac{1}{2} \quad (3.23)$$

$$\beta_1 = 3 \frac{\Delta^1}{\Delta_x^1}$$

The equation (3.16) is therefore replaced by equation (3.23).

Case (2): If $x_n$ is an extreme point, then equation (2.2) reads in analogous fashion $$s''(x_1)=0 \text{ and } s'(x_n)=0 \quad (3.24)$$

The spline is again uniquely determined with the aid of equation (3.24). In this case also, no natural spline is obtained. The initial value specified in equation (3.13) must accordingly be modified as follows:

If equation (3.19) with $s'(x_n)=0$ is solved for $s''(x_n)$ and $s''(x_{n-1})$ is replaced by $s''(x_{n-1})=\alpha_{n-1}\cdot s''(s_n)+\beta_{n-1}$, then the result is the following:

$$s''(x_n) = -3 \frac{1}{1+\frac{1}{2}\alpha_{n-1}} \cdot \left[ \frac{\Delta^{n-1}}{\Delta_x^{n-1}} + \frac{1}{6} \beta_{n-1} \right]. \quad (3.25)$$

With regard to the above, the case $\alpha_{n-1}=-2$ (pol in the denominator) is excluded as $|\alpha_1|23 \frac{1}{2}$. Equation (3.13) is thus replaced by equation (3.25).

Running of the Algorithms

In the first instance the division, described previously, of the set of data points into subsets is undertaken, to the extent that non-differentiable or respectively extreme points are present. In this case, consideration is also given to combinations, for example a subset $U=\{(x_i,y_i), i \in \tilde{M}\}, \tilde{M}=\{j_i, \ldots j_2\}$ with $j_1, j_2 \in N$ can commence with the non-differentiable point $x_{j_1}$ and end with the extreme point $x_{j_2}$. Similar considerations apply to all further possible combinations.

In a second step, the algorithms, previously described are then applied to the subsets of the data points. To this end, for each subset the renumbering of the indices, which has been explained, is undertaken, so that the algorithms are executed in each instance for data points $(x_i, y_i)$ with $i=1, \ldots, n$ where $n=j_2-j_1=1$.

If an error occurs during the run, then the algorithm is interrupted.

Special Case: n=2

In this subsection, it is further to be demonstrated that the described algorithm also gives reasonable results in the case n=2 (ie. where only 2 data points are available for the interpolation).

In this case, the algorithm reveals (equations (3.18), (3.20)) that $s'(x_1)=\Delta^1$ and thus $s'(x_2)=\Delta^1$. The following emerges for the coefficients: $a_{i,0}=y_1$, $a_{i,1}=a\Delta^1$, $a_{i,2}=a_{i,3}=0$ (equation (3.3)). Thus, the spline reads: $s(x)=\Delta^1 \cdot (x-x_1)+y_1$. Thus, as expected, the result is a straight line which joins the two data points $(x_1, y_1)$ and $(x_2, y_2)$.

Computation of Step Widths

The simulator can, in addition to the description of the component by mathematical equations, also require details as to the matter of with what accuracy (step width) these equations are to be executed in the corresponding partial intervals. This is the case, for example, with the analog simulator SABER. A high accuracy (small step width) can be required if the function curve deviates from the linear behavior of a straight line, or a rapidly altering region of the curve (high gradient) is to be considered with greater accuracy.

In the first case, the curvature of the spline s—(x) is a measure of the accuracy: high curvature requires high accuracy. The maximum of the curvature within a prescribed interval can be used as an indicative measure. This my readily be determined, since the second derivative $s''(x)$ is a linear polynomial (it is sufficient to consider the marginal values in the respective interval $I_i$).

In the second case, it is possible to have recourse either to the gradient $s'(x)$ or, better, to the arc length b(s), described in equation (2.6), of the spline. b(s) can be used directly as an indicative measure; the maximum of the gradient must be determined from the marginal values and the possibly present relative extremes (defining equation $s'(x_E)=0$).

Example of Application

In this subsection, the application of our method to a specific example is to be tested. To this end, a current-limiting diode of type F452 was selected. The characteristic of the diode includes both an extreme point and also a non-differentiable point. A data sheet was available from the distributor, from which data sheet data points of the characteristic could be inferred. Table 1 shows a list of the data points as they were made available for the method as input. Simulation took place using an analog simulator (DC Transfer Analysis). FIG. 1 shows the characteristic of the diode, as obtained as the result of the simulation.

Figure 2:
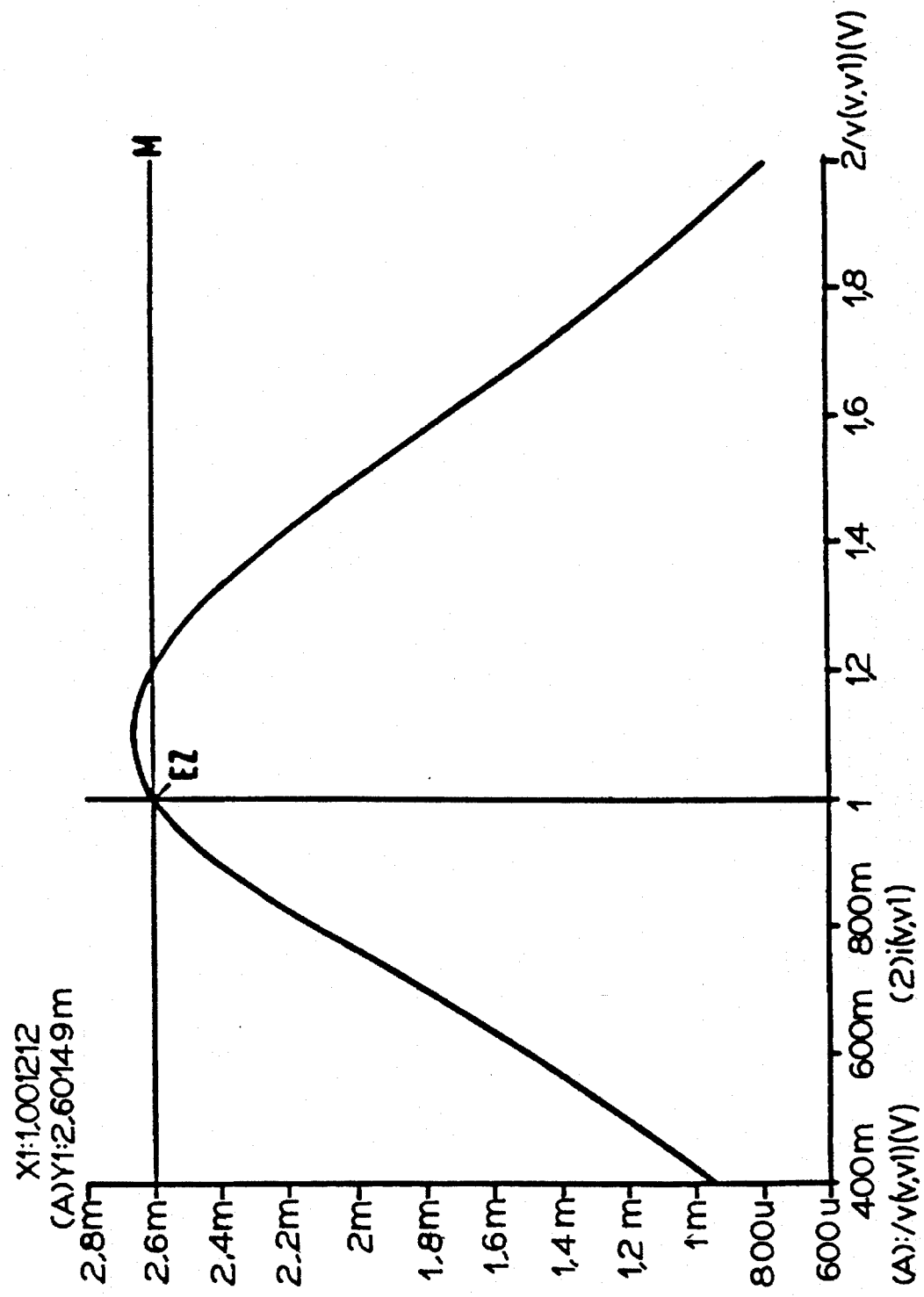
FIG. 2 shows the simulation for a component which does not exceed a maximum point.
Figure 4:
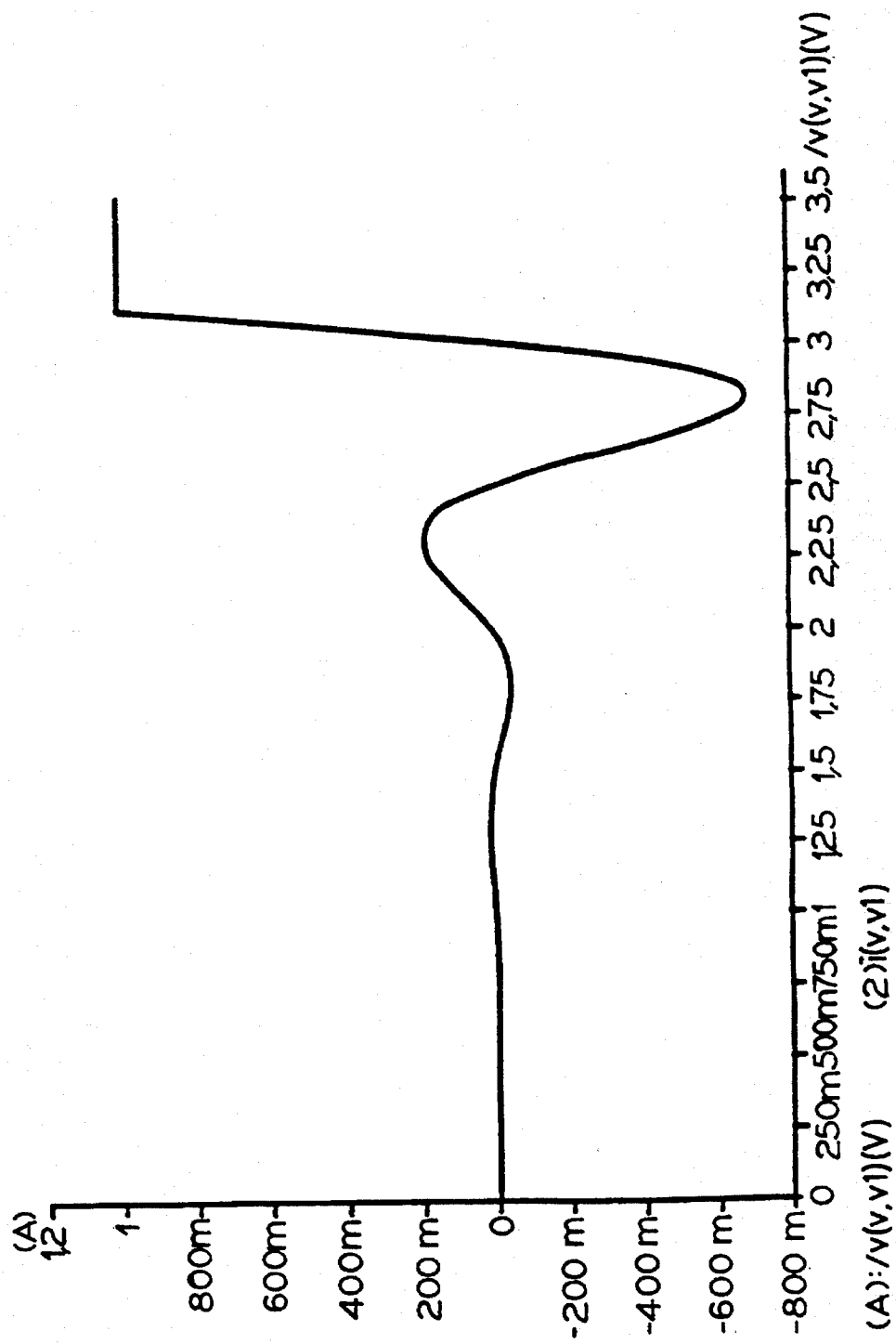
FIG. 4 shows simulation of a component using the method of the present invention.
Figure 5:
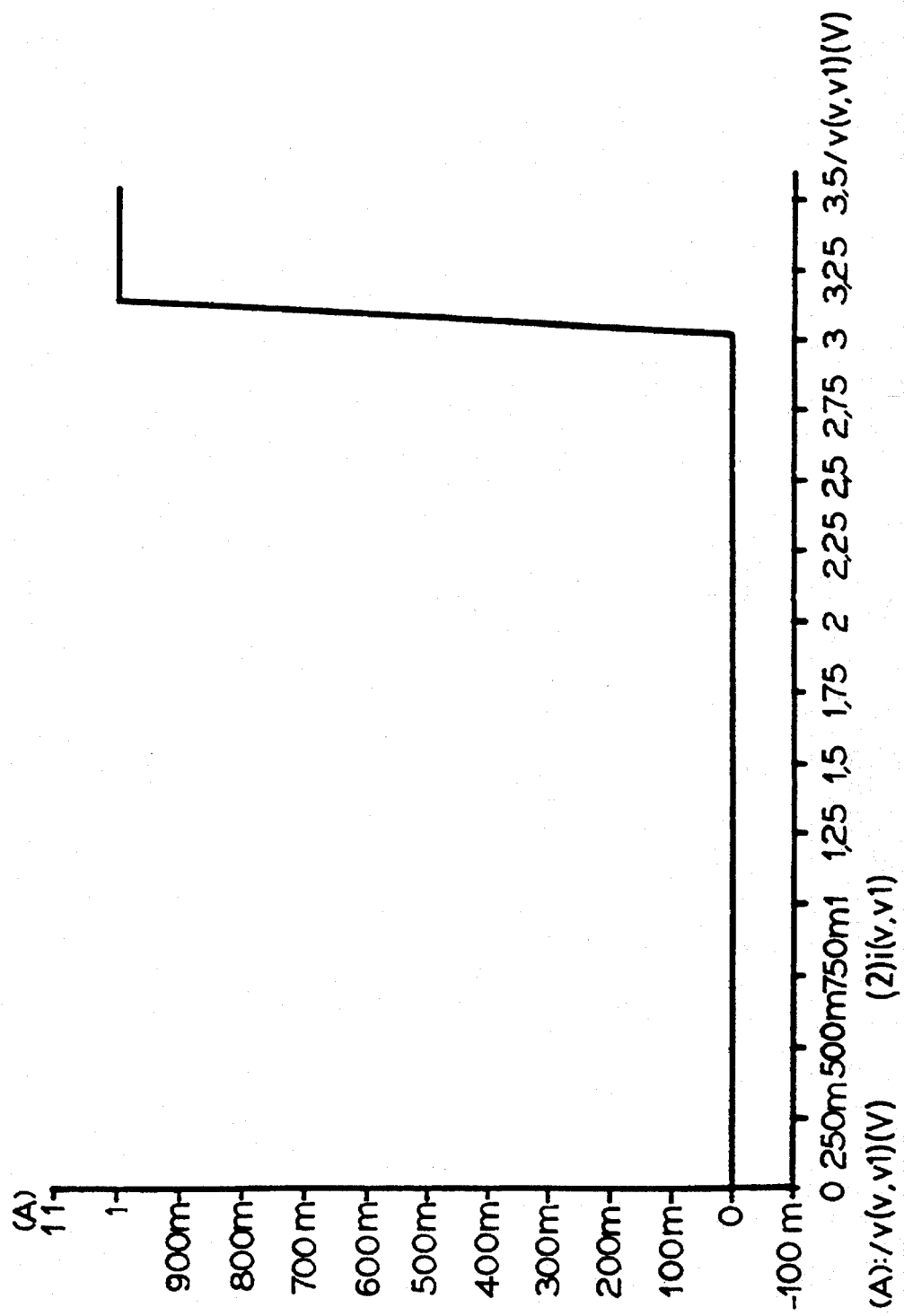
FIG. 5 shows another simulation of a component using the method of the present invention.

To illustrate the effect of explicitly prescribed non-differentiable or respectively extreme points, the method was carried out with and without their explicit specification. Table 2 shows in the first instance once again a list of data points as they served as input. The maximum lies at a voltage of 1 volt. FIG. 2 shows the simulation without prescribed maximum point. It is possible to see clearly the displacement of the maximum by approximately 0.1 volt towards higher values. The result of the modeling with a prescribed extreme point is to be seen in FIG. 3: the function curve now adopts its maximum precisely at the defined value of 1 volt. The effect of non-differentiable points is represented in FIGS. 4 and 5: FIG. 4 reveals the undesired "oscillation" of the spline if the "breakdown voltage" at 3 volts is not identified as a non-differentiable point. As is seen in FIG. 5, the problem is entirely overcome by the explicit prescription of such points.

The pairs of values which form the basis of the function curves which are represented in the figures are located in the similarly designated tables.

FIG. 1 shows the result of the simulation of a diode F452 using the method according to the invention. (Current-voltage characteristic). This simulation is based on the pairs of values derived from Table 1. They are represented in simplified form for the method according to the invention. In the first instance, the representation of the pairs of values in exponential form is agreed with "scale 1e-3". A point is characterized by the designation point. The pair of values follows horizontally in the next two columns. Subsequently, an identification is specified, which communicates to the method according to the invention whether particular characteristics are to be observed in the computation of this point. −s signifies a normal data point, −d signifies a non-differentiable data point, and −e signifies an extreme value. It can clearly be recognized from the result of the simulation that the extreme value E is correctly reproduced at a voltage of 8 volts, and the non-differentiable point D (kink) at the voltage of 130 volts, by the method according to the invention.

FIG. 2 shows the simulation result for a component which must not exceed a maximum M at the point 1 and 2.6. The simulated result is based on the pairs of values represented in Table 2. As can clearly be seen, the point E2, which is provided as maximum in the pairs of values, is indeed in the simulation result a component part of the function curve but it is not the maximum. In the case of the simulation undertaken here, the criterion for extreme values "−e" which is provided in the method according to the invention was not used in the definition of the pairs of values. This is expressed in a displacement of the maximum in the curve progression represented.

Figure 3:
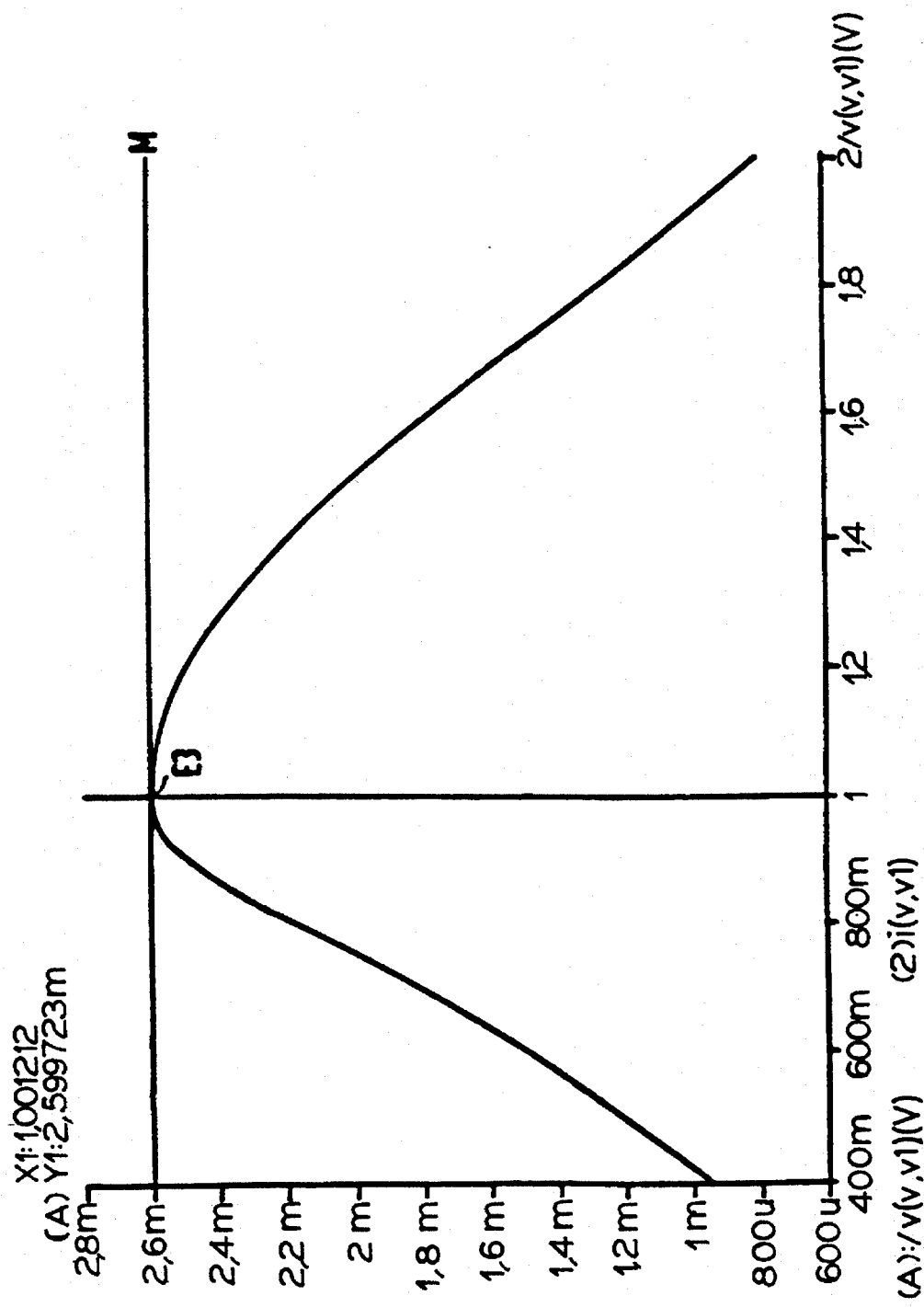
FIG. 3 shows the curve progression after simulation using the method of the present invention.

FIG. 3 shows the curve progression as it is obtained after simulation using the method according to the invention, which is based on the same family of input value pairs as FIG. 2, with the exception that the point 1 and 2.6 in Table 3 is identified as extreme value by "−e". In this case, it can clearly be recognized that the extreme value E3 has been displaced as compared with the version represented in FIG. 2, and is now situated approximately at the correct position.

In FIG. 4, a component is simulated using the method according to the invention, the characteristic properties of which are represented in value pair Table 4. It is a characterizing feature of this component that its function curve exhibits a non-differentiable point (kink) at a voltage of 3 volts. For the simulation, this point was not explicitly identified by an option "−d" in Table 4. The result of the simulation clearly shows that the component is inclined to oscillate during the simulation and that the curve progression which characterizes the component is not correctly represented by the simulation.

FIG. 5 shows the result of a simulation using the method according to the invention, which simulation is based on the pairs of values derived from Table 5. Table 5 is distinguished in relation to Table 4, which was simulated in FIG. 4, only in that the point at 3 volts was now characterized as non-differentiable by the option "−d". It can clearly be recognized that the simulation using the method according to the invention now leads to a correct result, which describes characteristic properties of the component. This means that the kink at a voltage of 3 volts is correctly reproduced.

Figure 6:
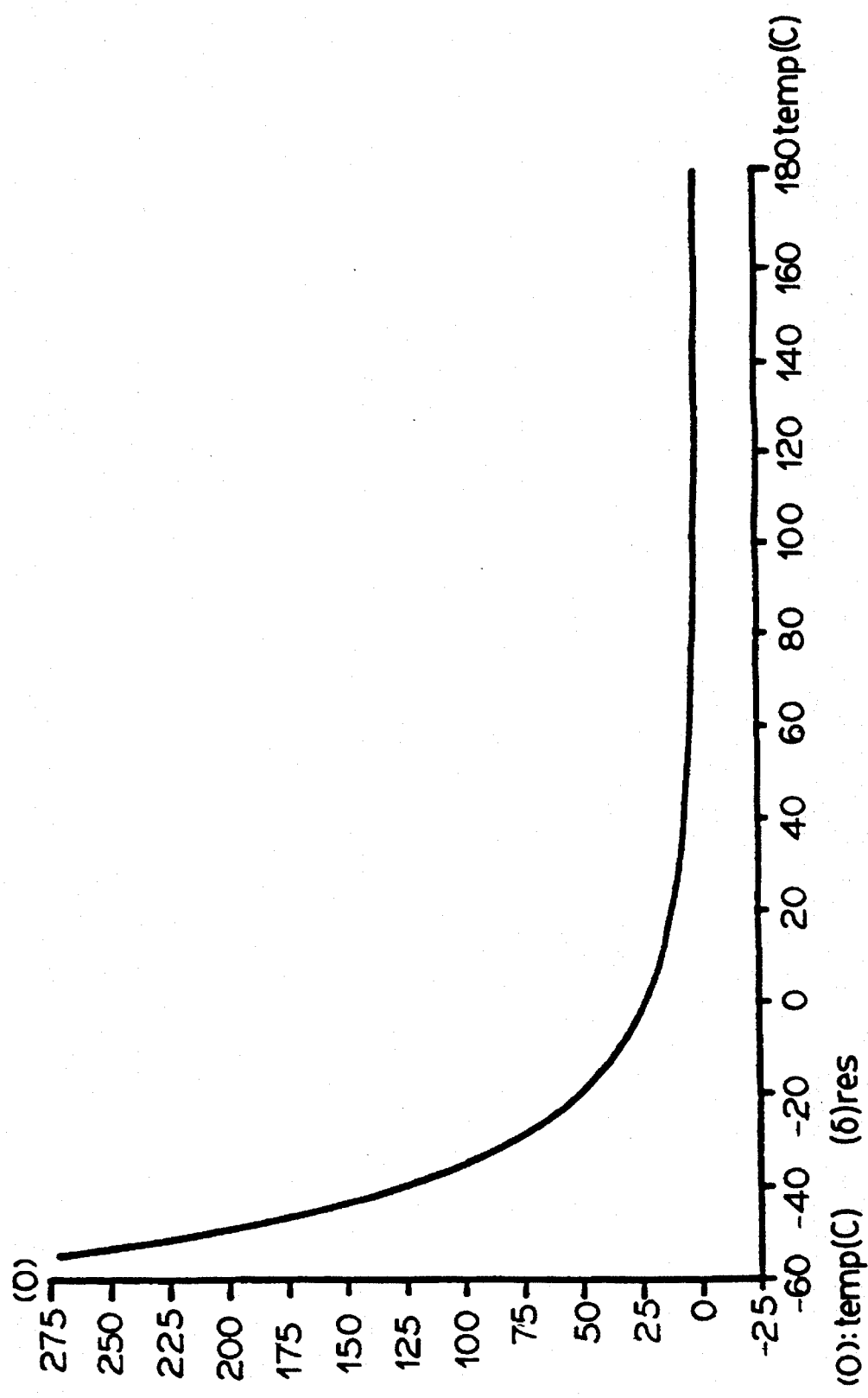
FIG. 6 shows yet a further simulation of a component using the method of the present invention.

FIG. 6 shows the result of a simulation using the method according to the invention, which simulation is based on the pairs of values derived from Table 6. In this case, the intention is in particular to show the behavior of the method according to the invention where a large set of pairs of values is input. In this case, the temperature curve of the hot conductor S235 (Siemens-Matsushita) is simulated. It is clearly possible to recognize that the simulation using the method according to the invention also leads to a correct result in the case of a large number of pairs of values input.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

TABLE 1 scale 1e-3

| point | −0.9 | −881. | −s |
| point | −0.6 | −302. | −s |
| point | −0.5 | −149. | −s |
| point | −0.4 | −46. | −s |
| point | −0.3 | −8.18 | −s |
| point | −0.2 | −1.1 | −s |
| point | −0.1 | −0.138 | −s |
| point | 0. | 0. | −d |
| point | 0.5 | 0.6 | −s |
| point | 0.7 | 0.9 | −s |
| point | 1. | 1.3 | −s |
| point | 1.5 | 2. | −s |
| point | 2. | 2.5 | −s |
| point | 3. | 3.3 | −s |
| point | 4. | 3.8 | −s |
| point | 5. | 4.2 | −s |
| point | 7. | 4.38 | −s |
| point | 8. | 4.4 | −e |
| point | 8.1 | 4.4 | −s |
| point | 10. | 4.39 | −s |
| point | 130. | 2.5 | −d |
| point | 131. | 1000. | −s |

TABLE 2 scale 1e-3

| point | 0. | 0. | −s |
| point | 0.5 | 1.2 | −s |
| point | 0.7 | 1.8 | −s |
| point | 1. | 2.6 | −s |
| point | 1.5 | 2.0 | −s |
| point | 2. | 0.8 | −s |
| point | 3. | 0.0 | −s |

TABLE 3 scale 1e-3

| point | 0. | 0. | −s |
| point | 0.5 | 1.2 | −s |
| point | 0.7 | 1.8 | −s |
| point | 1. | 2.6 | −e |
| point | 1.5 | 2.0 | −s |
| point | 2. | 0.8 | −s |
| point | 3. | 0.0 | −s |

TABLE 4 scale 1e-3

| point | 0. | 0. | −s |
| point | 0.5 | 0.1 | −s |
| point | 1.0 | 0.2 | −s |
| point | 1.5 | 0.4 | −s |
| point | 2. | 0.6 | −s |
| point | 2.5 | 0.9 | −s |
| point | 3. | 1.2 | −s |
| point | 3.1 | 1000.0 | −s |

TABLE 5 scale 1e-3

| point | 0. | 0. | −s |
| point | 0.5 | 0.1 | −s |
| point | 1.0 | 0.2 | −s |
| point | 1.5 | 0.4 | −s |

TABLE 5-continued scale 1e-3

| point | 2.  | 0.6    | -s |
| ----- | --- | ------ | -- |
| point | 2.5 | 0.9    | -s |
| point | 3.  | 1.2    | -d |
| point | 3.1 | 1000.0 | -s |

TABLE 6 scale 1e-1

| point | -55 | 27.119   | -s |
| ----- | --- | -------- | -- |
| point | -50 | 20.748   | -s |
| point | -45 | 16.035   | -s |
| point | -40 | 12.521   | -s |
| point | -35 | 9.8633   | -s |
| point | -30 | 7.8415   | -s |
| point | -25 | 6.2836   | -s |
| point | -20 | 5.0768   | -s |
| point | -15 | 4.1312   | -s |
| point | -10 | 3.3866   | -s |
| point | -5  | 2.7944   | -s |
| point | 0   | 2.3211   | -s |
| point | 5   | 1.9315   | -s |
| point | 10  | 1.6303   | -s |
| point | 15  | 1.3779   | -s |
| point | 20  | 1.1709   | -s |
| point | 25  | 1        | -s |
| point | 30  | 0.85816  | -s |
| point | 35  | 0.73986  | -s |
| point | 40  | 0.64074  | -s |
| point | 45  | 0.55721  | -s |
| point | 50  | 0.48657  | -s |
| point | 55  | 0.42652  | -s |
| point | 60  | 0.37530  | -s |
| point | 65  | 0.33141  | -s |
| point | 70  | 0.29364  | -s |
| point | 75  | 0.26105  | -s |
| point | 80  | 0.23280  | -s |
| point | 85  | 0.20826  | -s |
| point | 90  | 0.18683  | -s |
| point | 95  | 0.16809  | -s |
| point | 100 | 0.15164  | -s |
| point | 105 | 0.13715  | -s |
| point | 110 | 0.12436  | -s |
| point | 115 | 0.11304  | -s |
| point | 120 | 0.10299  | -s |
| point | 125 | 0.094040 | -s |
| point | 130 | 0.086055 | -s |
| point | 135 | 0.078918 | -s |
| point | 140 | 0.072516 | -s |
| point | 145 | 0.066766 | -s |
| point | 150 | 0.061586 | -s |
| point | 155 | 0.056912 | -s |
| point | 160 | 0.052685 | -s |
| point | 165 | 0.048857 | -s |
| point | 170 | 0.045380 | -s |
| point | 175 | 0.042221 | -s |
| point | 180 | 0.039341 | -s |

What is claimed is:

1. A method of simulating at least one component, whose characterizing features are described by a set of pairs of values, by means of a simulator on a computer, the method comprising the steps of:

a) providing pairs of values of a component and using, in a first step for spline interpolation, a cubic spline function of the form:

$$s(x) = a_{i,3} \cdot (x-x_i)^3 + a_{i,2} \cdot (x-x_i)^2 + a_{i,1} \cdot (x-x_i) + a_{i,0}$$

with said pairs of values $(x_i, y_i)$, $i = 1, \ldots, n$ where $n \in N$ which are sorted in ascending sequence according to the magnitude of $x_i$ and form interval limits of partial intervals for the spline interpolation;

b) determining coefficients $a_{i,3}$, $a_{i,2}$, $a_{i,1}$, $a_{i,0}$ for each partial interval as:

$a_{i,0} = y_i$
$a_{i,1} = s'(x_i)$
$a_{i,2} = 1/2 \cdot s''(x_i)$ $$a_{i,3} = \frac{s''(x_{i+1}) - s''(x_i)}{6 \cdot (x_{i+1} - x_i)}$$

using recursion formulae $$s'(x_{i+1}) = \Delta^i - \frac{1}{3} \Delta_x^i \left( s''(x_i) + \frac{1}{2} s''(x_{i+1}) \right)$$

$$s'(x_n) = \Delta^{n-1} + \frac{1}{6} \Delta_x^{n-1} \cdot s''(x_{n-1})$$

$\Delta_x^i := x_{i+1} - x_i$
$\Delta_y^i := y_{i+1} - y_i$ $$\Delta_i := \frac{\Delta_y^i}{\Delta_x^i}$$

$$d_i := \frac{\Delta_x^i}{\Delta_x^{i+1}}$$

and with use of $s''(x_1) = \alpha_1 \cdot s''(x_2) + \beta_1$ $$\alpha_{i+1} = -\frac{1}{\alpha_i d_i + 2 \cdot (1 + d_i)}$$

$$\beta_{i+1} = \frac{1}{\alpha_i d_i + 2 \cdot (1 + d_i)} \cdot \left( 6 \frac{\Delta^{i+1} - \Delta^i}{\Delta_x^{i+1}} - d_i \beta_i \right)$$

$\alpha_1 = \beta_1 = 0$.

as well as boundary conditions for natural splines $s''(x_1) = 0$ and $s''(x_n) = 0$ for all pairs of values a function s(x) being found which allocates in each instant to one value of a respective pair of values the other value of the respective pair of values, Index "'" signifies 1st derivative
Index "''" signifies 2nd derivative; and c) using in the simulator, in a further step, the function to determine further arbitrary pairs of values for the component and thereby simulate operation of the component.

2. The method as claimed in claim 1, wherein the method further comprises:

a) generating a non-differentiable point in a progression of the function in that the set of pairs of values is subdivided into two subsets, in which the point is included; and b) carrying out the spline interpolation for each subset of the two subsets, the point being used on one occasion as an upper interval bound and on the other occasion as a lower interval bound related to the two subsets for the spline interpolation.

3. The method as claimed in claim 1, wherein extreme points are prescribed for the function, in that the coefficients a are determined using a common recursion formulae in the following manner:

a) for $x_1$ as extreme point with the use of, $$\alpha_1 = -\frac{1}{2}$$

$$\beta_1 = 3\frac{\Delta^1}{\Delta_x^1}$$

as well as extreme value conditions $s'(x_1)=0$ and $s''(x_n)=0$;

b) for $x_n$ as extreme point with the use of, $$s''(x_n) = -3\frac{1}{1+\frac{1}{2}\alpha_{n-1}} \cdot \left(\frac{\Delta^{n-1}}{\Delta_x^{n-1}} + \frac{1}{6}\beta_{n-1}\right).$$

as well as extreme value conditions $s''(x_1)=0$ and $s'(x_n)=0$.

4. A method for manufacturing an electronic circuit by simulating at least one component, whose characterizing features are described by a set of pairs of values, by means of a simulator on a computer, the method comprising the steps of:

a) providing pairs of values of said at least one component and using, in a first step for spline interpolation, a cubic spline function of the form:

$$s(x)=a_{i,3}\cdot(x-x_i)^3+a_{i,2}\cdot(x-x_i)^2+a_{i,1}\cdot(x-x_i)+a_{i,0}$$

with said pairs of values $(x_i, y_i)$, $i=1,\ldots,n$ where $n\epsilon N$ which are sorted in ascending sequence according to the magnitude of $x_i$ and form interval limits of partial intervals for the spline interpolation;

b) determining coefficients $a_{i,3}$, $a_{i,2}$, $a_{i,1}$, $a_{i,0}$ for each partial interval as:

$a_{i,0} = y_i$
$a_{i,1} = s'(x_i)$
$a_{i,2} = 1/2 \cdot s''(x_i)$ $$a_{i,3} = \frac{s''(x_{i+1}) - s''(x_i)}{6\cdot(x_{i+1}-x_i)}$$

using recursion formulae $$s'(x_{i+1}) = \Delta^i - \frac{1}{3}\Delta_x^i\left(s''(x_i) + \frac{1}{2}s''(x_{i+1})\right)$$

$$s'(x_n) = \Delta^{n-1} + \frac{1}{6}\Delta_x^{n-1}\cdot s''(x_{n-1})$$

$\Delta_x^i := x_{i+1} - x_i$
$\Delta_y^i := y_{i+1} - y_i$ $$\Delta^i := \frac{\Delta_y^i}{\Delta_x^i}$$

$$d_i := \frac{\Delta_x^i}{\Delta_x^{i+1}}$$

and with use of $s''(x_1) = \alpha_1 \cdot s''(x_2) + \beta_1$ $$\alpha_{i+1} = -\frac{1}{\alpha_i d_i + 2\cdot(1+d_i)}$$

$$\beta_{i+1} = \frac{1}{\alpha_i d_i + 2\cdot(1+d_i)} \cdot \left(6\frac{\Delta^{i+1}-\Delta^i}{\Delta_x^{i+1}} - d_i\beta_i\right)$$

$\alpha_1 = \beta_1 = 0$.

as well as boundary conditions for natural splines $s''(x_1)=0$ and $s''(x_n)=0$ for all pairs of values a function s(x) being found which allocates in each instant to one value of a respective pair of values the other value of the respective pair of values, Index "'" signifies 1st derivative
Index "''" signifies 2nd derivative;

c) using in the simulator, in a further step, the function to determine arbitrary pairs of values for the component and thereby simulate operation of the at least one component; and d) constructing said electronic circuit that contains said at least one component according to said simulated operation of said at least one component.

5. The method as claimed in claim 4, wherein the method further comprises:

a) generating a non-differentiable point in a progression of the function in that the set of pairs of values is subdivided into two subsets, in which the point is included; and b) carrying out the spline interpolation for each subset of the two subsets, the point being used on one occasion as an upper interval bound and on the other occasion as a lower interval bound related to the two subsets for the spline interpolation.

6. The method as claimed in claim 4, wherein extreme points are prescribed for the function, in that the coefficients are determined using a common recursion formulae in the following manner:

a) for $x_1$ as extreme point with the use of, $$\alpha_1 = -\frac{1}{2}$$

$$\beta_1 = 3\frac{\Delta^1}{\Delta_x^1}$$

as well as extreme value conditions $s''(x_1)=0$ and $s''(x_n)=0$;

b) for $x_n$ as extreme point with the use of, $$s''(x_n) = -3\frac{1}{1+\frac{1}{2}\alpha_{n-1}} \cdot \left(\frac{\Delta^{n-1}}{\Delta_x^{n-1}} + \frac{1}{6}\beta_{n-1}\right).$$

as well as extreme value conditions $s''(x_1)=0$ and $s'(x_n)=0$.

\* \* \* \* \*